United States Patent
Wunderer et al.

(10) Patent No.: US 8,536,030 B2
(45) Date of Patent: Sep. 17, 2013

(54) SEMIPOLAR SEMICONDUCTOR CRYSTAL AND METHOD FOR MANUFACTURING THE SAME

(75) Inventors: Thomas Wunderer, Waltenhofen (DE); Stephan Schwaiger, Ulm (DE); Ilona Argut, Ulm (DE); Rudolph Rosch, Ichenhausen (DE); Frank Lipski, Neu-Ulm (DE); Ferdinand Scholz, Ulm (DE)

(73) Assignee: Freiberger Compund Materials GmbH, Freiberg (DE)

( * ) Notice: Subject to any disclaimer, the term of this patent is extended or adjusted under 35 U.S.C. 154(b) by 363 days.

(21) Appl. No.: 13/051,154

(22) Filed: Mar. 18, 2011

(65) Prior Publication Data
US 2011/0227198 A1  Sep. 22, 2011

(30) Foreign Application Priority Data
Mar. 18, 2010 (DE) .......................... 10 2010 011 895

(51) Int. Cl.
  H01L 29/04 (2006.01)
  H01L 21/20 (2006.01)
  C30B 25/18 (2006.01)
  C30B 25/04 (2006.01)

(52) U.S. Cl.
  USPC ............... 438/481; 117/95; 117/97; 257/615; 257/E29.004; 257/E21.121

(58) Field of Classification Search
  USPC ...................... 117/95, 97, 101, 104; 257/615, 257/E29.004, E29.113, E21.121; 438/481
  See application file for complete search history.

(56) References Cited

U.S. PATENT DOCUMENTS

| 7,220,324 B2 | 5/2007 | Baker et al. |
| 7,645,688 B2 | 1/2010 | Lee et al. |
| 2010/0308437 A1 * | 12/2010 | Okuno et al. ................. 257/615 |

OTHER PUBLICATIONS

Okada et al. "Growth of Semipolar (11-22) GaN Layer by Controlling Anisotropic Gworth Rates in r-Plane Patterned Sapphire Substrate". Appl. Phys. Expr. 2 (Aug. 2009) 091001-01 to 091001-03.*
Okado et. al., "Direct growth of m-plane GaN with epitaxial lateral overgrowth gtom c-plane sidewall of a-plane sapphire", Appl.Phys. Expr., 1 (2008), pp. 111101-1 to 111101-3.
"Ceramic X-Ray tubes for XRD", Madison WI., USA, Bruker Advanced X-Ray Solutions GmbH, Commercial Brochure 2002.
Hertkorn, J., et .al., "Optimization of nucleation and bufferlayer growth for improved GaN quality", J.Crys.Growth., vol. 308, No. 1 (2007) p. 30-36.
Kuhn. B. et. al., "An Oxygen Doped Nucleation Layer for the Growth of High Optical Quality GaN on Sapphire", Phys. Stat.Sol. (a) 188 (2), 2001, pp. 629-633.

(Continued)

Primary Examiner — Julio J Maldonado
Assistant Examiner — Daniel Shook
(74) Attorney, Agent, or Firm — A.C. Entis-IP Ltd.

(57) ABSTRACT

A method of manufacturing a semipolar semiconductor crystal comprising a group-III-nitride (III-N), the method comprising: providing a substrate comprising sapphire ($Al_2O_3$) having a first surface that intersects c-planes of the sapphire; forming a plurality of trenches in the first surface, each trench having a wall whose surface is substantially parallel to a c-plane of the substrate; epitaxially growing a group-III-nitride (III-N) material in the trenches on the c-plane surfaces of their walls until the material overgrows the trenches to form a second planar surface, substantially parallel to a (20-2l) crystallographic plane of the group-III-nitride, wherein l is an integer.

20 Claims, 5 Drawing Sheets

(56) References Cited

OTHER PUBLICATIONS

Okada, N., et. al., "Growth of Semipolar (1122) GaN Layer by Controlling Anisotropic Growth Rates in r-Plane Patterned Sapphire Substrate" Appl.Phys.Expr., 2 (2009) 091001-01 to 091001-03.
Spieβ, L., "Moderne Rontgenbeugung—Rontgendiffraktometrie fur Materialwissenschaftler, Physiker und Chemiker" Teubner (2005) p. 88-89.
Wei, T.B., et. al., "Growth of (1013) Semipolar GaN on m-plane Sapphire by Hydride Vapor Phase Epitaxy" J.Cryst.Growth 311 (17), 2009, pp. 4153-4157.
Zhou, L., et. al., "Structural Characterization of Non-Polar (1120) and Semi-Polar (1126) GaN Films Grown on r-plane Sapphire" J.Cryst.Growth, 310 (12) 2008, pp. 2981-2986.
English Translation of German Office Action—DE 10 2010 011 895.8, Nov. 16, 2010.
PCT International Search Report PCT/EP2011/001339; Apr. 28, 2011.

* cited by examiner

SEMIPOLAR SEMICONDUCTOR CRYSTAL AND METHOD FOR MANUFACTURING THE SAME

RELATED APPLICATIONS

This application claims benefit under 35 U.S.C. §119(a)-(d) of German application DE 10 2010 011 895.8, filed Mar. 18, 2010, the disclosure of which is incorporated herein by reference

FIELD

Embodiments of the invention relate to a semipolar semiconductor crystal comprising a group-III-nitride (III-N) as well as to a method for manufacturing the same.

BACKGROUND

Semiconductor materials formed from group-III-group-V compounds are primarily used in light-emitting diodes (LEDs) based—among others—on their property to emit light in a broad wavelength range. In the following "III" and "V" denote elements of the corresponding main group of the periodic table of chemical elements. In particular, group-III-nitride compounds turned out to be specifically suitable for the green to ultraviolet wavelength range, for example GaN (gallium nitride), InGaN (indium gallium nitride), AlGaN (aluminium gallium nitride) and AlGaInN (aluminium gallium indium nitride).

The above referred to compounds are commonly grown by metal organic vapour phase epitaxy (MOVPE), hydride vapour phase epitaxy (HVPE) or molecular beam epitaxy (MBE), etc. on a start substrate, in order to manufacture a monocrystal. Unfortunately, GaN-monocrystals substrates having a satisfactory size on which to grow the compounds are generally not presently available. Thus, "foreign" substrates, wherein materials comprising an almost compatible crystal system are utilized. For gallium nitride, sapphire ($Al_2O_3$) or silicon carbide (SiC) are typically used. When forming the final end products, the substrates are removed from the gallium nitride-monocrystal via chemical or mechanical methods, etc.

Gallium nitride (by which term in the following also shall be comprised its ternary or quaternary compounds) includes a hexagonal wurtzite crystal grid and thus has a similar crystal structure as sapphire, which comprises a trigonal corundum-grid. Crystal growth is currently, generally performed along the c-axis [0001] during epitaxy, i.e., perpendicular to the c-plane (0001), the c-axis being the symmetry axis of the hexagonal structure. The surface of the sapphire substrate (wafer) provided as a substrate surface on which the crystal is grown is chosen to have lattice constants sufficiently close to those of the crystal c-plane to support acceptable growth of the crystal. The c-plane (0001) thus also characterizes the final GaN-crystal as it is then utilized, for example, in LEDs.

Due to the polar structure of the crystal along the c-axis [0001], considerable piezoelectric fields may arise in the case of GaN in conjunction with the crystal geometry. A band shift may be generated along the c-axis from which the so-called quantum confined stark effect (QCSE) may result. In the QCSE, distances between wave functions of electrons and holes in quantum wells (QW) produced along this direction by alternating layer sequences, are increased. The increase leads to a red shift and reduced recombination rate of the electrons and holes in the LEDs, etc.

The c-plane as the surface of the GaN-monocrystal is thus denoted as "polar". In contrast thereto, the m-planes {1-100} or a-planes {11-20} in the GaN-monocrystal, which are perpendicular to the c-plane, are nonpolar, since the Ga and N-atoms are positioned in the same plane. Consequently, many attempts were made to manufacture GaN-monocrystals having surfaces, which are correspondingly oriented at the m- or a-planes.

Since, however, as described above, foreign substrates have to be used as a start material, the problem arises just in these cases, that stacking-faults, etc. may occur.

Nevertheless, Okado N. et al.: in "*Direct growth of m-plane GaN with epitaxial lateral overgrowth from c-plane sidewall of a-plane sapphire*", Appl. Phys. Expr. 1 (2008), page 111101 report that nonpolar GaN (m-plane), or {1-100}, may be grown via MOVPE on a sapphire substrate having {11-20}-orientation (a-plane).

For this purpose, trenches separated by ridges are formed in the sapphire substrate by means of reactive ion-etching (RIE). Lateral facets of the ridges include an inclination of 68 or 79 degrees, respectively, with respect to the horizontal direction. The top face of the ridges is masked by a $SiO_2$ layer having a thickness of 200 nm, in order to inhibit growth of GaN on top of the same. The top faces of the ridges have a width of 4 µm, while the trenches have a corresponding width of 2 µm. The bottom face of the trenches has a width of only 0.5 µm due to the inclined facets.

The epitaxial growth process started horizontally in the trenches in c-direction [0001] at the facet, which is more inclined (79 degrees), since the angle between the c-direction and the surface normal herein amounts to "only" 11 degrees. After reaching the opposite wall, the growth continues vertically with lateral overgrowth of the ridges, wherein the direction in the gallium nitride now corresponds to an {10-10}-orientation (m-plane) due to a 30-degrees-rotation. In view of the lateral overgrowth over the ridges, the individual layers finally merge upon further growth.

A surface roughness measurement conducted with an atomic force microscope (AFM) amounted to 1.1 nm (are size 5×5 µm, RMS), whereas the crystal quality has been determined by an x-ray measurement via the Rocking Curve to yield a full width half maximum (FWHM) of 500 arc seconds azimuthally in the <10-10>-direction, or of 650 arc seconds azimuthally in the <0001>-direction for the (10-10)-surface of the grid.

The formation of a semipolar GaN-layer was thereafter described by Okada, N. et al.: in "*Growth of semipolar (11-22) GaN-layer by controlling anisotropic growth rates in r-plane patterned sapphire substrate*", Appl. Phys. Expr. 2 (2009), page 091001. "Semipolar" denotes, polarity values between the extremes of the c-plane polarity and the m- or a-plane polarity.

By an appropriate choice of the process conditions in the MOVPE-process it was possible to omit the masks upon the ridges. The top face of the ridges were oriented along the r-plane (1-102) of the sapphire substrate, whereas the lateral facets were again inclined (about 32 degrees with respect to the horizontal direction), however, this time its normals were oriented parallel to the c-plane inclined within the sapphire substrate, such that a single-sided growth in c-direction [0001] in the trench was guaranteed. The r-plane is not perpendicular to the c-plane. Due to the 30 degree-rotation about the c-axis upon growth on the sapphire, the gallium nitride crystal grid achieves by its [11-22]-direction in vertical direction the same spatial orientation as compared with the [1-102]-direction of the crystal grid of the sapphire substrate.

Regarding crystal quality, rocking curve-measurements yielded full width half maximum (FWHM) values of 720, or 319 arc seconds, parallel and perpendicular to the c-direction for the (11-22)-grid planes, respectively.

The growth has been supported particularly by the almost similar angles between the r-plane and the c-plane of the sapphire and between the (11-22)-plane and the c-plane of the gallium nitride.

From document U.S. Pat. No. 7,220,324 B2 it is known to grow a GaN-layer having {10-11}-orientation on a {10-10}-spinel substrate (MgAl$_2$O$_4$). The spinel substrate thereby is not structured, since the method of forming ridges and trenches followed by a two-step growth due to the facet inclinations and the small area sizes, is considered insufficient and complex.

From document U.S. Pat. No. 7,645,688 B2 it is known to use a (11-23) oriented sapphire substrate to grow thereupon a nonpolar gallium nitride layer oriented in the direction of the m-plane (<10-10>-directions). The substrate is substantially unstructured. One would basically select an r-plane sapphire substrate in order to grow nonpolar (11-20)-GaN, i.e., a-plane GaN. However, it is proposed therein to use (11-23)-oriented sapphire substrate instead, since the grid dimensions in both planes (sapphire-GaN) are compatible with each other and m-plane-GaN is considered being more stable than a-plane-GaN.

SUMMARY

Embodiments of the invention provide new methods of manufacturing III-N-monocrystals having semipolar properties.

According to an embodiment of the invention, a method of manufacturing a semipolar semiconductor crystal comprising a group-III-nitride (III-N) includes, among others, steps of providing a start substrate comprising sapphire (Al$_2$O$_3$) and having a first surface parallel to a crystallographic plane of the sapphire, and epitaxially growing a semipolar crystal layer comprising the group-III-nitride (III-N) on the start substrate above the first surface thereby forming a second surface, which is substantially parallel to the first surface and is formed by a semipolar crystallographic plane of the group-III-nitride.

According to one embodiment of the method it is proposed to obtain a semipolar {20-2l} oriented III-N-layer, in particular a gallium nitride layer, by epitaxial growth starting from a sapphire substrate oriented in a predetermined direction. l herein represents an integer, namely l=1, 2, 3, 4 . . . . The results found herein with regard to surface roughness and crystalline quality of the final product, surprisingly, are substantially improved relative to hitherto known semipolar or nonpolar GaN-layers having other orientations.

Particularly high crystalline qualities have been found for a combination of a {11-23} oriented sapphire substrate having a {10-11} oriented III-N layer grown thereupon, i.e., l=2 in the expression for orientation given in the preceding paragraph. (It is noted that setting l=2 in the expression for orientation, {20-2l}, in the preceding paragraph yields {20-22}. Conventional nomenclature mandates removing common denominators from the orientation coordinates so that {20-22} becomes, in accordance with the convention, {10-11}.)

Alternatively, also the following combinations of surface crystal orientations for sapphire and GaN may be utilized: {20-21}-GaN (i.e., l=1) on {22-43}-sapphire and {10-12}-GaN (i.e., l=4) on {11-26}-sapphire. Further to the above described family of {20-2l} oriented III-N-layers, also a combination of {11-21}-GaN on {10-11}-sapphire is comprised by embodiments of the invention. It has been found, that the surface roughness and the crystalline quality of the final product also herein surprisingly delivers remarkably improved results. The method is for all combinations substantially the same.

The III-N-, or GaN-layer, respectively, grows "upon" the surface of the sapphire. "Upon" herein denotes the space extending along the normal vector of the sapphire surface. It is possible that also layers of other materials, such as for example, nucleation and/or mask materials, may be positioned within this space partially between the sapphire and the III-N-, or GaN-layer respectively.

Regarding the sapphire, the "surface" denotes a large area surface plane (ground, lapped, polished, grown, etc.) that is present before any structuring such as the formation of trenches, etc. is applied, wherein the specified crystal plane is oriented parallel to that "surface".

According to an embodiment the formation of a trench or of multiple trenches is carried out in the sapphire substrate. The lateral facet(s) formed thereby serves as a starting point for crystal growth in c-direction at first. After reaching an opposite facet, the growing crystal material in trenches overflow and crystal material from neighbouring trenches coalesce to yield a closed {10-11}-plane, i.e. are grown together, and the growth continues in <10-11>-direction.

It has been found, that agreement of an angle between the <11-23>-directions and the c-plane of the sapphire and between the <10-11>-directions and the c-plane of the gallium nitride suffices to ensure crystal growth at high quality.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF FIGURES

Embodiments of the invention will be better understood with reference to specific embodiments when taken in conjunction with the accompanying drawings. Therein FIGS. 1a-1e show steps for manufacturing semipolar {10-11}-gallium nitride by virtue of a schematical cross-sectional profile according to an embodiment of the invention;

DETAILED DESCRIPTION

Figure 1A:
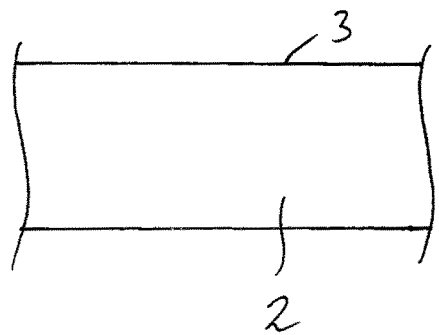
Figure 1B:
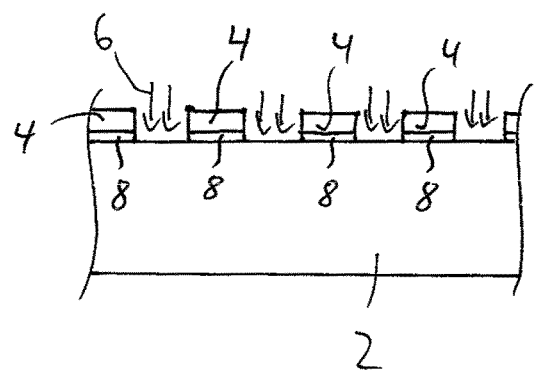
Figure 1C:
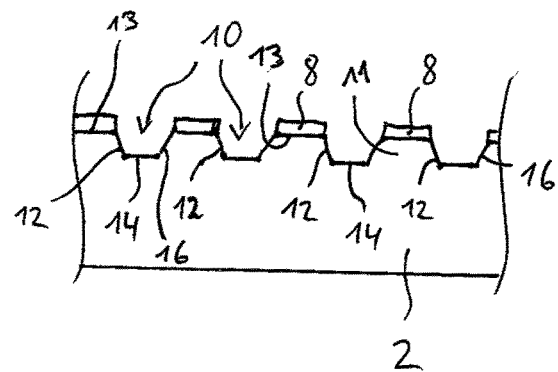
Figure 1D:
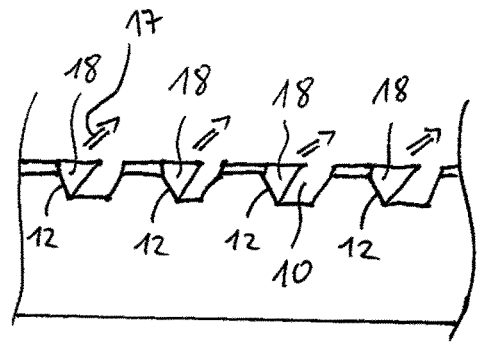

A method for manufacturing a semipolar gallium nitride according to an embodiment of the invention is schematically illustrated in FIGS. 1a-1e.

In a first step (FIG. 1a) a planar wafer made from sapphire (Al$_2$O$_3$) is provided, which has a surface 3, that corresponds to a crystal plane of orientation {11-23}. The wafer serves as a start substrate 2 for growing gallium nitride thereon. Such wafers are commercially available and in this specific example a 2"-wafer having a thickness of 430 μm was used. Modifications regarding the diameter and thickness are of course possible.

In a second step (FIG. 1b) the start substrate 2 is lithographically structured. For this purpose, a first mask layer 8 made from, optionally, SiO$_2$ having a thickness of 200 nm is deposited. A photoresist is then deposited upon the SiO$_2$-mask layer 8 and structured with a stripe pattern using commonly applied lithographical structuring methods. Then, a second mask layer 4 made from nickel and gold and having thickness of 550 nm is deposited. Thereafter, the photoresist is removed (note that the photoresist is not shown in FIG. 1b, however, see arrows regarding numeral 6), as a result of which only those regions of the second nickel-gold-mask layer remain adhering, which have been deposited directly on the first mask layer 8, while the other regions are removed together with the photoresist ("lift-off-process"). Alternatively, the Ni—Au-mask might also be etched. The stripes are optionally straight and optionally extend in the <10-10>-direction, which is parallel to the surface, are arranged parallel to each other and have a width of about 3 μm. The openings in the gold-nickel mask also, optionally, have a width of about 3 μm. Whereas, in the above example, the stripes and their separation are equal to 3 μm, generally the stripes and their separations do not have to be equal, and advantageously have values in a range from about 1 μm to about 10 μm.

Subsequently, the start substrate is exposed including both mask layers to a reactive ion beam etching process (RIE, numeral 4, or ICP-RIE), or is alternatively exposed to another arbitrary, preferably dry-chemical etching process, in which a trench 10 is etched into the sapphire crystal having a depth of between about 0.8-1.3 μm. The first SiO$_2$-mask layer is thereby also structured and remains only being present in regions, where it is protected by the Ni—Au-mask layer.

The trench walls 12, 16 formed thereby have for example an inclination angle, as measured from parallel to surface 3 is equal to about 75°. In this very specific example, that shall not be generalized to limit the scope of the invention, a power of 300 W, supply of gases of BCl$_3$, Cl$_2$ and Ar in a ratio of 2:2:1 and a pressure of 20 mTorr has been used for the etch process.

Whereas, in the above example, an inclination angle for the trench walls was 75° an inclination angle in accordance with an embodiment of the invention is advantageously between about 40° and 80°. Optionally, the inclination angle is between about 50° and 70°. Optionally, the inclination angle is substantially equal to about 62°. For 62°, the plane of the trench wall is substantially oriented parallel to the sapphire c-plane.

Thus, on the one side a facet 12 forms, whose surface is oriented roughly parallel to the (0001)-plane (c-plane) of the sapphire crystal such that a c-growth may be initiated—while on the facet 16 formed on the opposite side such growth is inhibited, since the deviation of its inclination from the c-orientation of the sapphire is too large. Between the trenches, ridges 11 remain in the sapphire substrate. These ridges thus comprise on their lateral sides the inclined facets as well as between the facets the top face, which corresponds to the original surface of the sapphire having a corresponding crystal orientation. The top face is still covered with the mask layer made from SiO$_2$.

Further, the lithographical structuring process is optionally arranged such that the trenches respectively extend along a <10-10>-direction (cf. FIG. 2), i.e., they are perpendicular to the m-plane of the sapphire (Al$_2$O$_3$) together with its facets 12. The normal vector of the a-plane would be directed roughly to the upper left side in the Figures.

In the illustrated embodiment, the mask layer 8 made from SiO$_2$ is provided below the Ni/Au-mask layer 4 and is then structured together with the sapphire. However, it may also be conceived that the SiO$_2$-mask layer is deposited after the etching of the Ni/Au-mask layer. Herein, the corresponding masks have nevertheless to be aligned with respect to each other. The sequence of masking and the materials employed thereby may be modified in an appropriate manner using alternatives known to the person skilled in the art.

The remaining portions of the Ni/Au-mask layer are removed by a wet-chemical method (for example 6 parts H$_2$O, 2 parts HCl and 1 part H$_2$O$_2$), whereas the SiO$_2$-mask layer may remain in position.

The MOVPE-growth optionally starts with depositing an oxygen-doped low temperature nucleation layer (not shown in the Figures) made from aluminium nitride (AlN).

The growth process is performed metal organic vapour phase epitaxy (MOVPE). MBE, HVPE and/or other suitable epitaxial methods known in the art. Nevertheless, MOVPE advantageous for growth. Moreover, a nucleation may optimally be performed on sapphire using MOVPE. Alternatives known to the person skilled in the art, in particular the above described methods, shall nevertheless be comprised by the general process proposed herein. In the specific example, a horizontal flow reactor Aixtron-200/4 RF-S was employed. trimethyl gallium (TMGa), trimethyl aluminum (TMAl) and highly purified ammonium gas (NH$_3$) were used as initial substances. Hydrogen, optionally mixed with nitrogen, is used as a carrier gas. The process temperature was controlled using the pyrometer on a downstream side of the substrate holder. In this example, about 1 μm GaN was grown at a temperature of 1130 degrees C. and a total pressure of 150 hPa.

Under these conditions the GaN-growth starts from the lateral facet 12, which as described above corresponds exactly or substantially or even only roughly to the c-plane of sapphire substrate 2, i.e., in all trenches 10 only on one side. On the other side of the trench some small amount of parasitic deposition of GaN may occur, however, with a considerably reduced growth rate. The growth on the top face of ridge 11 is inhibited by the second mask layer (SiO$_2$). The growth direction corresponds to the c-direction of the sapphire 2. Thereby, the crystal layer 18 of gallium nitride also continues to grow in its c-direction. As can be seen from the first sub-step of the inclined horizontal growth schematically represented by arrows 17 in the trench displayed in FIG. 1d, a tip forms in the growing gallium nitride, which approaches wall 16 of a corresponding opposite ridge 11.

Once tips of GaN 18 reach the opposite ridges, or parasitic depositions of GaN on the opposite ridges, the GaN in the trenches overflow, and GaN from adjacent trenches 10 merge. Then substantially vertical GaN crystal growth 19 (FIG. 1e) beyond the upper edge of the trench begins and marks the beginning of a second sub-step. The process conditions are, optionally, not changed in the second sub-step. Nevertheless, it also comes within the scope, to individually adjust the process conditions in order to enable improved growth. In the present example, growth proceeds in a vertical direction in the second sub-step.

After merging of adjacently growing crystal layers 18, these contact each other and form a common, continuous surface 22, as may be seen from FIG. 1e. Between the crystal layer 18 of GaN and the start substrate 2 of sapphire, so-called voids 20 may occur at the edges of the trenches opposing facets 12, i.e. facets 16, since the epitaxial growth does not necessarily fill the complete trench 10. The same may occur for a region between the adjacently vertically growing crystal layers 18 directly upon the top face 13 of the ridge, i.e., upon the masking layer 8 (cf. voids 21).

Figure 2A:
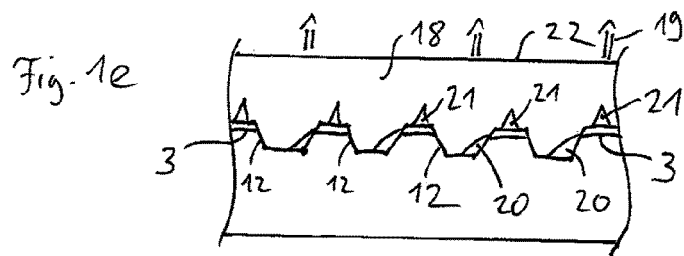
FIGS. 2a-2b schematically show initial and final stages respectively of crystal growth in accordance with an embodiment of the invention.
Figure 2A:
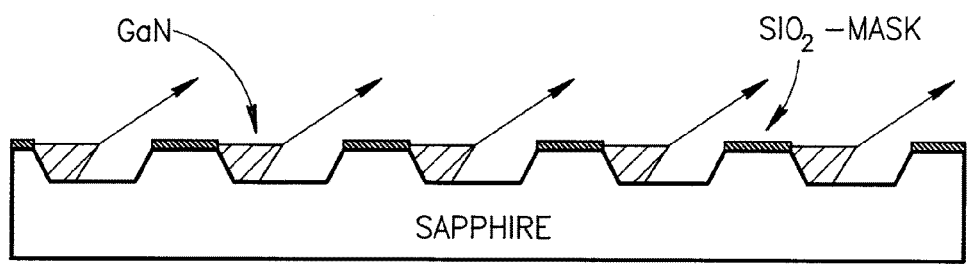
Figure 2B:
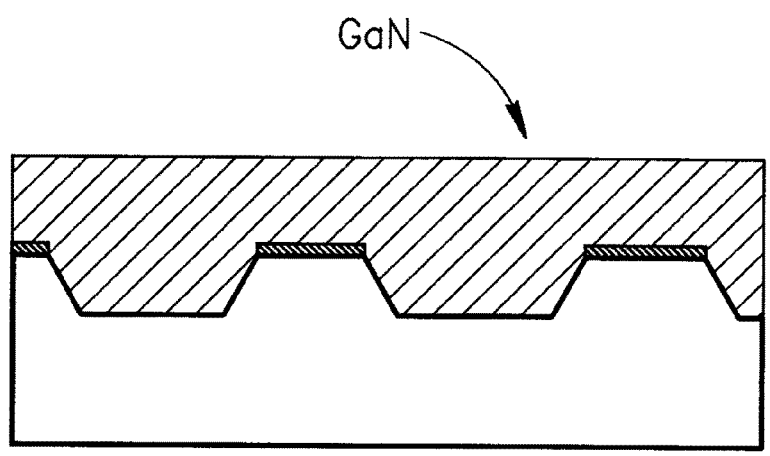
Figure 2C:
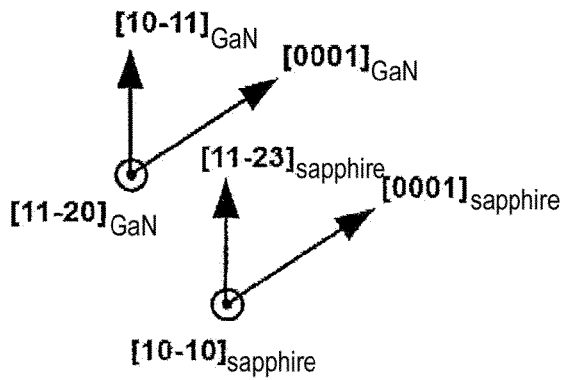
FIGS. 2c-2f show vector diagrams having spatial orientations of crystal directions during growth of a crystal in processes illustrated in FIGS. 1a-1e and FIGS. 2a-2b in accordance with an embodiment of the invention.
Figure 2D:
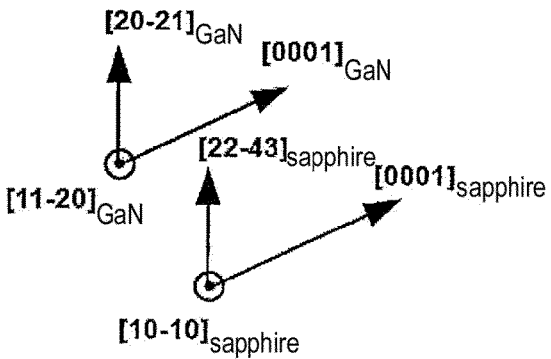
Figure 2E:
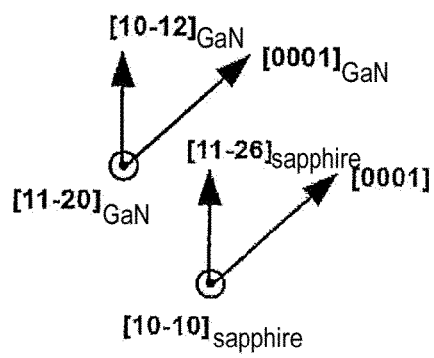
Figure 2F:
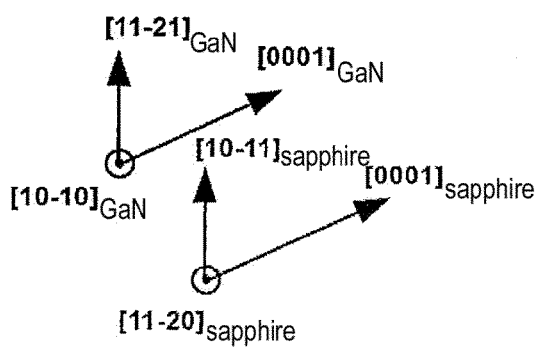

FIG. 2 once schematically more shows in simplified manner the two sub-steps of crystal growth at first in c-direction (FIG. 2a) and then in <10-11>-direction (FIG. 2b). FIG. 2c shows the crystal direction each in sapphire and in GaN with respect to the illustrations of FIG. 1a-e, or FIG. 2a-b, respectively, wherein in addition to the manufacturing of semipolar {10-11}-GaN are also shown further embodiments of the invention in an exemplary manner.

Figure 4:
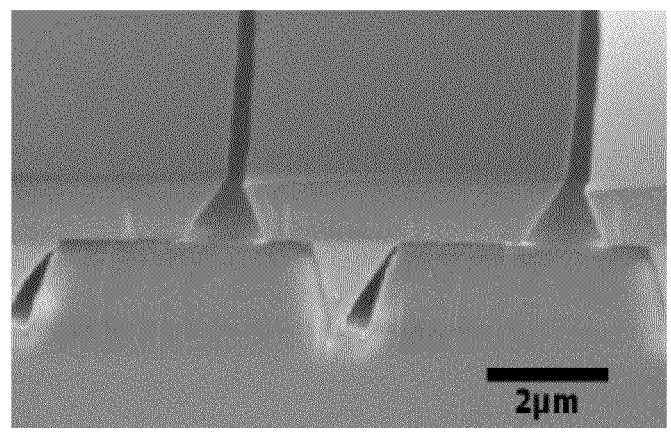
FIG. 4 shows a recording by a scanning electron microscope of a cross-section through the sapphire substrate and GaN-layer grown thereupon according to a further embodiment of the invention.

FIG. 4 shows a recording of a scanning electron microscope indicating a cross-section through the sapphire substrate 2 having a GaN-layer 18 grown thereupon according to a further embodiment of the invention. In contrast to the first embodiment, the widths of top faces 13 of the ridges are equal to about 4 μm and the corresponding widths of the trenches are equal to about 1.2 μm at the height of the upper edge of the trenches, or about 0.6 μm at the height of the bottom face 14 of the trenches. The recording shows a situation after the growing of about 1 μm GaN. The crystal layers 18 are in a state shortly before merging and the formation of a common surface 22.

The test substrates (sapphire 2 having the GaN-crystal layer grown thereupon) have been investigated in the embodiments in more detail. For quantifying the crystal quality, Rocking Curves (XRC) have been determined and ω-2θ-scans have been performed in the course of high resolution X-ray diffraction measurements (XRD). Further, low temperature photo luminescence spectra (PL, at 14K) have been recorded. The latter allow to conclude on defects, in particular stacking-faults in the basal plane. An ω-2θ-scan is shown in FIG. 3, a PL-spectrum is illustrated in FIG. 5.

Figure 3:
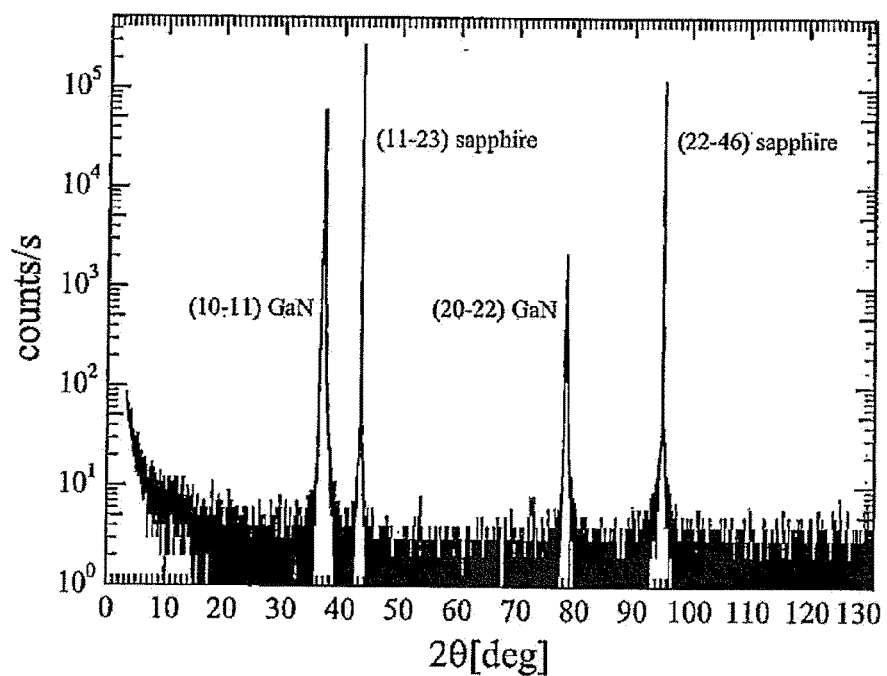
FIG. 3 shows a diagram of a rocking curve measured by x-ray diffraction from {1-23}-planes of a sapphire substrate and diffraction from {10-11}-planes of a GaN-layer (ω-2θ-scan) grown on the substrate in accordance with an embodiment of the invention.

In FIG. 3 the (10-11)-orientation of the grown crystal layer 18 of GaN may particularly be verified from the ω-2θ-scan. It is clearly visible in FIG. 3, that only those peaks occur, which are either associated with the {11-23}-family of sapphire ($Al_2O_3$), i.e. of the start substrate 2, or with the {10-11}-family of the gallium nitride (GaN) 18.

The corresponding measurement of the Rocking Curve (XRC) revealed full width at half maximum (FWHM) values of less than 400 arc seconds for the symmetric (10-11) reflection (diffraction peak, see FIG. 3) as well as for the asymmetric (0002)- or (10-12)-reflections (not shown in FIG. 3). The full widths at half maximum shed light on the crystal quality. 400 arc seconds represents a comparatively sound value for a material having a non-c orientation. The individually indicated diffraction peaks specify, what has exactly been measured and are used to interpret the measured widths. Some peaks turn out to be intrinsically narrower, while others are intrinsically broader. It is noted that the Rocking Curve measurements were performed—as common in semiconductor and/or epitaxy analysis—using Cu Kα—emission for the X-rays in high resolution X-ray diffractometry (XRD). FWHM values set forth herein and are based on this quasi-standard emission.

Figure 5:
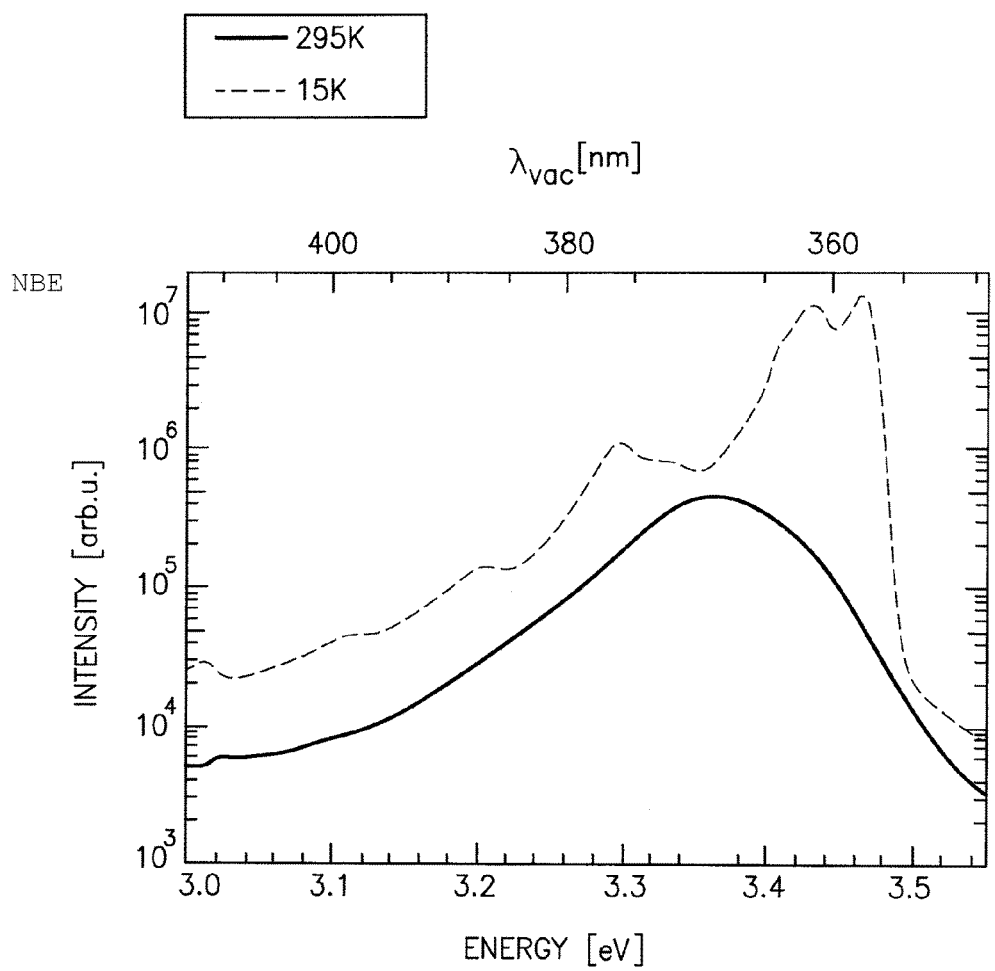
FIG. 5 shows a photo luminescence spectrum of the exemplary GaN-crystal layer of FIG. 4 according to an embodiment of the invention.

FIG. 5 shows the result of the photo luminescence-(PL)-spectra, recorded at 15 K (upper curve) and at 295 K (bottom curve). A near band edge emission (NBE) is clearly visible at 3.464 eV. In GaN-crystals grown on sapphire with semi- or nonpolar property, this luminescence is usually less pronounced, while therein the luminescence of faults dominates. Nevertheless, peaks are visible in FIG. 5—for example at 3.43 eV or at 3.30 eV—which may be attributed to such faults, in particular stacking-faults.

For determining the roughness of the (10-11)-surface obtained in the embodiment, measurements using an atomic force microscope (AFM), have been performed. Within an area having a size of 3 μm×3 μm a roughness of less than 0.3 nm (route mean square RMS) has been determined, and within an area having a size of 1 μm×1 μm a roughness of even less than 0.1 nm (RMS) has been measured.

The above described examples show investigations of GaN-crystal layers 18 grown up to about 1 μm thickness. However, practice of embodiments of the invention is of course not limited to layers of about 1 μm. Embodiments of the invention may be used to provide considerably thicker, merged GaN-layers 18, from which complete substrates for use in manufacturing opto-electronic components or components for sensor technologies, high frequency applications, etc. may be formed. Such substrates, which include the above described properties with regard to crystal quality and surface quality, are particularly advantageous in the manufacturing of components.

Hence, combinations of start substrate 2 with crystal layers 18 grown thereupon, as well as already separated, large-scaled III-N- or GaN-crystal layers are comprised by the scope of embodiments of the invention. Diameters of 2" or 4" or even more are realistic. No limit for the diameter is provided by embodiments of the invention.

Using MOVPE, moderate growth rates of about 2 μm/h may be obtained at present. In this case, a sapphire-wafer is preferably structured at first, wherein the GaN-layer is then grown using a MOVPE-method and after some μm the layer for the component is deposited.

In order to obtain considerably thicker layers ("a bulk" material), it may also be advantageous to employ a HVPE-method (growth rate 100 μm/h and more). In this case, some mm up to some cm can be deposited. Thereafter, the crystal or "boule" is cut into individual wafers with for example identical orientation and then the component layers are grown subsequently using MOVPE or MBE in corresponding reactors onto the resulting wafers.

In some embodiments of the invention, to grow thick semipolar GaN crystals, a thin GaN MOVPE-layer is formed as described above and followed by transferring the wafer into a HVPE-process (HVPE-reactor) for growing a comparatively thick crystal thereupon.

Further, in the above described methods detailed values for the process conditions (temperature, pressure, precursor gases, etch methods, epitaxy methods, number of process steps, materials for mask or nucleation layers, layer thicknesses, trench widths, etc.) have been provided. However, it pertains to the person skilled in the art to recognize that also modifications or deviations from such conditions are possible, such as they are basically known from the manufacturing of GaN or III-N-compound materials each having other known crystal orientations.

With regard to the mask layers, SiN or $Al_2O_3$ or other materials may for example also be considered. With regard to the nucleation layers it may be referred to various available literature, for example Kuhn, B. et al., in Phys. Status Solidi A. 188, p. 629, 2001, or Hertkorn, J. et al., in J. Cryst. Growth 308, p. 30, 2007 in the case of low temperature nucleation layers, to which the present method shall, however, not be limited.

With regard to the temperatures in the reactor, there is a dependence among others also from the respective type of reactor, such that the above described values are only valid for the specific example. Even for the specified type of reactor there may be made deviations from the temperatures. As a MOVPE-reactor or a HVPE-reactor, any type be it commercially available or not, may be considered, which is capable of growing a III-N-crystal layer.

Corresponding considerations do not only relate to the exemplary combination of start crystal and grown crystal as described above. Rather, these also relate to modifications including the following combinations of surface crystal orientations for sapphire and GaN: {2-201}-GaN on {22-43}-sapphire, {10-12}-GaN on {11-26}-sapphire as well as {11-21}-GaN on {10-11}-sapphire.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

Descriptions of embodiments of the invention in the present application are provided by way of example and are not intended to limit the scope of the invention. The described embodiments comprise different features, not all of which are required in all embodiments of the invention. Some embodiments utilize only some of the features or possible combinations of the features. Variations of embodiments of the invention that are described, and embodiments of the invention comprising different combinations of features noted in the described embodiments, will occur to persons of the art. And, unless otherwise stated, adjectives such as "substantially" and "about" modifying a condition or relationship characteristic of a feature or features of an embodiment of the invention, are understood to mean that the condition or characteristic is defined to within tolerances that are acceptable for operation of the embodiment for an application for which it is intended. The scope of the invention is limited only by the claims.

The invention claimed is:

1. A method of manufacturing a semipolar semiconductor crystal comprising a group-III-nitride (III-N), the method comprising:
   providing a substrate comprising sapphire (Al$_2$O$_3$) having a first surface that intersects c-planes of the sapphire;
   forming a plurality of trenches in the first surface, each trench having a wall whose surface is substantially parallel to a c-plane of the substrate;
   epitaxially growing a (III-N) material in the trenches on the c-plane surfaces of their walls until the material overgrows the trenches to form a second surface, substantially parallel to the first surface;
   wherein the first and second surfaces are planar surfaces substantially parallel to crystallographic planes denoted respectively by first and second crystallographic notations in a pair of notations chosen from the group consisting of: {11-23}/{10-11}; {22-43}/{20-21}; {11-26}/{10-12}; and {10-11}/{11-21}.

2. The method according to claim 1, wherein the wall surface is inclined with respect to the sapphire c-plane by an angle less or equal to about 25°.

3. The method according to claim 1, wherein the wall surface is inclined with respect to the sapphire c-plane by an angle less or equal to about 15°.

4. A method according to claim 1 and comprising continuing growing the material after it has overgrown the trenches until the material from different trenches coalesces to configure the second surface as an extended substantially continuous surface bounding a layer of the (III-N) material.

5. A method according to claim 4 wherein the (III-N) layer has thickness equal to or greater than about 1 μm.

6. A method according to claim 4 wherein the (III-N) layer has a thickness equal to or greater than about 100 μm.

7. A method according to claim 4 wherein the (III-N) layer has a thickness equal to or greater than about 1 mm.

8. A method according to claim 4 wherein the (III-N) layer has a thickness equal to or greater than about 1 cm.

9. A method according to claim 4 wherein the (III-N) layer has a dimension substantially parallel to the second surface that is greater than or equal to about 5 cm.

10. A method according to claim 4 and comprising removing the substrate to provide a free standing (III-N) semipolar semiconductor crystal.

11. A method according to claim 4, wherein the crystal layer is characterized by a Rocking Curve with respect to {10-11} crystallographic planes having a full width at half maximum (FWHM) of less than about 400 arc seconds.

12. A method according to claim 4, wherein the crystal layer is characterized by a Rocking Curve with respect to {10-11} crystallographic planes having a full width at half maximum (FWHM) of less than about 100 arc seconds.

13. A method according to claim 12 and comprising continuing growing the material after it has overgrown the trenches until the material from different trenches coalesces to configure the second surface as an extended substantially continuous surface bounding a layer of the (III-N) material.

14. A method according to claim 4, wherein the second surface is characterized by a surface roughness less than about 1.0 nm (RMS), in surface areas of about 3 μm×3 μm as determined by atomic force microscopy.

15. A method according to claim 4, wherein the second surface is characterized by a surface roughness less than about 0.3 nm (RMS), in surface areas of about 3 μm×3 μm as determined by atomic force microscopy.

16. A method according to claim 1, wherein the (III-N) material comprises at least one of, gallium nitride (GaN), indium gallium nitride (GaInN), aluminium gallium nitride (AlGaN), or AlGaInN.

17. A method of manufacturing a semipolar semiconductor crystal comprising a group-III-nitride (III-N), the method comprising:
   providing a substrate comprising sapphire (Al$_2$O$_3$) having a first surface that intersects c-planes of the sapphire;
   forming a plurality of trenches in the first surface, each trench having a wall whose surface is substantially parallel to a c-plane of the substrate;
   epitaxially growing a group-III-nitride (III-N) material in the trenches on the c-plane surfaces of their walls until the material overgrows the trenches to form a second planar surface, substantially parallel to a (20-2l) crystallographic plane of the group-III-nitride, wherein l is an integer.

18. A free standing (III-N) semipolar semiconductor crystal having a relatively large external surface substantially parallel to a (20-2l) crystallographic plane of the group-III-nitride, wherein l is an integer.

19. A free standing (III-N) semipolar semiconductor crystal according to claim 18, wherein the crystal is characterized by a Rocking Curve with respect to {10-11} crystallographic planes having a full width at half maximum (FWHM) of less than about 100 arc seconds.

20. A free standing (III-N) semipolar semiconductor crystal according to claim 18, wherein the external surface is characterized by a surface roughness less than about 0.3 nm (RMS), in surface areas of about 3 μm×3 μm as determined by atomic force microscopy.

* * * * *